United States Patent [19]
Huggins

[11] Patent Number: 5,845,064
[45] Date of Patent: *Dec. 1, 1998

[54] METHOD FOR TESTING AND VERIFICATION OF A CPU USING A REFERENCE MODEL

[75] Inventor: James D. Huggins, Hudson, Mass.

[73] Assignee: Digital Equipment Corporation, Maynard, Mass.

[ * ] Notice: This patent issued on a continued prosecution application filed under 37 CFR 1.53(d), and is subject to the twenty year patent term provisions of 35 U.S.C. 154(a)(2).

[21] Appl. No.: 888,420

[22] Filed: Jul. 7, 1997

Related U.S. Application Data

[63] Continuation of Ser. No. 686,179, Jul. 23, 1996, abandoned, which is a continuation of Ser. No. 526,300, Sep. 11, 1995, abandoned.

[51] Int. Cl.[6] .................................................... G06F 13/00
[52] U.S. Cl. ............................... 395/183.09; 395/183.02; 395/185.08
[58] Field of Search ......................... 395/183.09, 183.08, 395/183.16, 183.13, 183.14, 183.02, 183.01, 183.07, 184.01, 185.08

[56] References Cited

U.S. PATENT DOCUMENTS

| | | | |
|---|---|---|---|
| 4,819,233 | 4/1989 | Delucia et al. | 371/19 |
| 5,067,129 | 11/1991 | Evans et al. | 371/16.1 |
| 5,161,158 | 11/1992 | Chakravarty et al. | 371/15.1 |
| 5,187,788 | 2/1993 | Marmeistein | 395/700 |
| 5,233,611 | 8/1993 | Triantafyllos et al. | 371/16.1 |
| 5,412,802 | 5/1995 | Fujinami et al. | 395/575 |
| 5,414,836 | 5/1995 | Baer et al. | 395/575 |
| 5,469,463 | 11/1995 | Polich et al. | 395/182.18 |

OTHER PUBLICATIONS

Automator QA Developer Guide with Examples (1991) by Direct Technology, at 1–4 to 1–15, 4–21 to 4–24, 5–24 to 5–34.

Automator QA Programmer Reference Manual (1991) by Direct Technology, at 1–7, 3–47, 4–24 to 4–25.

Thevenod–Fosse, From Random Testing of Hardware to Statistical Testing of Software, Advanced Computer Technology, Reliable Systems and Applications, 5th Annual European Computer Conference CompEuro '91, May 13–16, 1991, at 200.

Myers, Art of Software Testing (1979) at 56–69.

Beizer, Software System Testing and Quality Assurance (1984) at 91–140.

Automator QA User Guide (1991) by Direct Technology, at 2–2, 3–8 to 3–9, 5–1 to 5–6, A–4 to A–6.

Kantowitz, Michael and Noack, Lisa M., "Functional Verification of a Multiple–issue, Pipelined, Superscalar Alpha Processor — the Alpha 21164 CPU Chip", 1995, vol. 7, No. 1, at 136–143.

Gould, Lawrence, "Another Tool in the Planning Toolbox", Managing Automation, Jul. 1992, pp. 22–23.

Quinnell, Richard, A., "Experiment–design software puts your hardware to the test", EDN, Jul. 8, 1993, at 94–98.

Anderson, "Logical Verification of the NVAX CPU Chip Design", Digital Technical Journal, vol. 4, No. 3, Summer 1992, at 38–46.

Ahi, Ali, M. et al., "Design Verification of the HP 9000 Series 700 PA–RISC Workstations", Aug. 1992, Hewlett–Packard Journal, at 34–42.

*Primary Examiner*—Robert W. Beausoliel, Jr.
*Assistant Examiner*—Norman M. Wright
*Attorney, Agent, or Firm*—Anne E. Saturnelli

[57] ABSTRACT

A method of testing a circuit design is provided which allows for the comparison output of an abstract reference model of the circuit and the circuit itself to the same set of input stimuli. The circuit under test may operate in a manner which produces unpredictable events, results, or data. Due to the nature of the reference model, unpredictable results, data, or events are not allowed to occur. Thus to compare the outputs of the two as a means of verifying the circuit design, the testing method allows for a comparison analysis of the outputs despite the possibility of unpredictable data and events occurring on the circuit and not the model.

8 Claims, 19 Drawing Sheets

IMPERCISE TRAP EXAMPLE

REF ~110

| PC | INST | SRC'S | DEST |
|---|---|---|---|
| 1 | ADDF | F0, F1 | → F20 |
| 2 | ADDF | F0, F2 | → F21 * 112 |
| 100 | IMPERCISE TRAP START | | |
| 100+m | READ | TRAP STATE | → R0 |
| 100+n | LDF | | → F21 |
| 100+p | RETURN | | |
| 3 | ADDF | F0, F3 | → F22 |
| 4 | ADDF | F0, F4 | → F23 |
| 5 | ADDF | F0, F5 | → F24 |

DUT ~120

| PC | INST | SRC'S | DEST |
|---|---|---|---|
| 1 | ADDF | F0, F1 | → F20 |
| 2 | ADDF | F0, F2 | → F21 * |
| 3 | ADDF | F0, F3 | → F22 |
| 4 | ADDF | F0, F4 | → F23 122 |
| 100 | IMPERCISE TRAP START | | |
| 100+m | READ | TRAP STATE | → R0 |
| 100+n | LDF | | → F21 |
| 100+p | RETURN | | |
| 5 | ADDF | F0, F5 | → F24 |

\* - INSTRUCTION CAUSES TRAP

FIG. 9

IMPERCISE TRAP WRITE EXAMPLE

REF

| PC | INST | SRC'S | DEST |
|---|---|---|---|
| 1 | ADDF | F0,F1 | F20 |
| 2 | ADDF | F0,F2 | (F21) * |
| 100 | IMPERCISE | TRAP START | |
| 100+m | READ | TRAP STATE | R0 |
| 100+n | LDF | | (F21) |
| 100+p | RETURN | | |
| 3 | ADDF | F0,(F21) | F22 |
| 4 | ADDF | F0,F4 | F23 |
| 5 | ADDF | F0,F5 | F24 |

— 170
— 172

DUT

| PC | INST | SRC'S | DEST |
|---|---|---|---|
| 1 | ADDF | F0,F1 | F20 |
| 2 | ADDF | F0,F2 | (F21) * |
| 3 | ADDF | F0,(F21) | F22 |
| 4 | ADDF | F0,F4 | F23 |
| 100 | IMPERCISE | TRAP START | |
| 100+m | READ | TRAP STATE | R0 |
| 100+n | LDF | | (F21) |
| 100+p | RETURN | | |
| 5 | ADDF | F0,F5 | F24 |

— 180
— 182

\* - INSTRUCTION CAUSES TRAP

FIG. 13

METHOD FOR TESTING AND VERIFICATION OF A CPU USING A REFERENCE MODEL

This application is a continuation of application Ser. No. 08/686,179, filed Jul. 23, 1996, now abandoned, which is a continuation of application Ser. No. 08/526,300, filed Sep. 11, 1995, now abandoned.

BACKGROUND OF THE INVENTION

This invention relates generally to computer systems and more particularly to a method and apparatus for verifying the design of a central processing unit (CPU).

As is known in the art, a computer system generally includes a CPU, a memory system, a cache system, and an I/O system, all of which are interconnected by various busses. The CPU, which may be constructed of a single chip or multiple chips, also generally includes an arithmetic logic unit, a program counter, a plurality of high speed memory locations known as registers, a means for reading and writing memory, and control logic for fetching instructions to and from memory. Further, the CPU includes means for executing the instructions fetch for memory.

Once a computer system has been designed, system designers need to verify the operation of the CPU. The verification is done to ensure that the CPU operates as designed and that the CPU interfaces properly with each of the elements described above.

In order to verify that each element of the newly designed computer system functions properly, system verification engineers will create a computer model of the CPU chip or chipset. In addition, models will be created for each of the subsystem elements in order to provide stimulus to the CPU model. Each element in the system has a unique model which represents its operation in the form of its response to input stimulus. The models can be created using specialized programming languages developed solely for that purpose, or they can be created using general purpose programming languages such as the C programming language. Since the CPU is the heart of most computer systems, the model of the CPU is typically the most complex and sophisticated. In order to properly verify the functionality of the CPU, various stimulus are applied to the model and the models response to that stimulus is recorded and analyzed.

In order to sufficiently test the CPU, the model must be exercised as extensively as possible. Prior art methods of testing a CPU design included the creation of so-called focus tests. Focus tests are tests written by system verification engineers who choose the type and nature of the stimulus to be applied to the CPU model. The focus tests are typically constructed by hand, by a system verification engineer with little or no automation. The focus test program written by the system verification engineer would include those test stimuli which the engineer feels are appropriate for the CPU model. In addition to creating the test stimulus program, the engineer would also need to build in a method of checking the results of the applied stimulus to the CPU model, Another prior art method of creating verification test programs involves the use of so-called exercisers. An exerciser is a program which has knowledge of each of the possible commands which can be executed by the CPU. It has further knowledge of possible delays or hand shaking methods which will be used when the CPU communicates with other subsystems of the overall system. An exerciser randomly selects, from each of the parameters of which it has knowledge, operations to be performed by the CPU model thus creating a test program to be applied to the CPU model. The advantage of using exercisers is that they tend to provide far more complete tests in a shorter time frame. Further, utilizing an exerciser separates the design process mentality from the verification portion of a CPU design. Most importantly, the use of an exerciser allows the creation of events (that is the combination of various stimuli) that no system verification engineer may have ever thought of.

There are various ways in which the test files created by exercisers may be used to verify designs. One method is to apply the same test files to the design to be verified and an abstract representation of the of the design known as the reference model. The results of each test file application are recorded and compared. Any mismatches in the recorded results are flagged as problems and used to further diagnose the design.

Prior art methods of checking a design against a reference model have been performed manually by a verification engineer or in some instances using a limited level of automation. This tended to make the comparison process labor intensive and expensive. Furthermore, prior art methods were only capable of verify those test results which were written to memory which could lead to undetected errors propagating to the final design. Also, prior art methods could not tolerate so called unpredictable results associated with imprecise architectures such as the Digital Equipment Corporation Alpha AXP Architecture. Therefore prior art methods of comparison verification were severely limited in the amount of actual verification that could be achieved using randomly generated test files.

Thus it would be advantageous to provide an improved means of comparison verification which includes ways to check intermediate results and also is tolerant of unpredictable events.

SUMMARY OF THE INVENTION

In accordance with the present invention, a method for testing a central processing unit (CPU) includes constructing an abstract reference model of the CPU and generating a test file of random test stimuli. Thereafter, the test stimuli are applied to both the reference model and the CPU. During testing, the output response for both the CPU and reference model are recorded in separate trace files. Once testing has been completed the trace files are compared on an entry by entry basis. During comparison, differences between an entry in the reference model trace file and the CPU trace file are detected and flagged. Once the differences are detected, a determination is made as to whether the discrepancy is due to an operational error or whether the difference is due to operational timing differences between the CPU and the reference model because of the imprecise nature of the CPU architecture. If the discrepancy is due to the timing differences, the operation causing the discrepancy and its associate data will be tagged as being unpredictable. Despite the differences, analysis continues on the trace files. The unpredictable data values are tracked and as they propagate through the trace file. In addition, any data resulting from the use of the unpredictable data is tagged as unpredictable and tracked as well. An output file is then created which is a report of all errors discovered as well as any unpredictable data that remained at the end of the analysis. With such an arrangement, a complete verification can be performed between a reference model and a device under test which is based on an imprecise architecture. Despite the unpredictable data and events which may occur on the device under test, the two trace files can be compared in an automated fashion with useful results being reported.

BRIEF DESCRIPTION OF THE DRAWINGS

The above-mentioned and other features of the invention will now become more apparent by reference to the following description taken in connection with the accompanying drawings in which:

FIG. 9 is a diagram of two instruction streams which lead to an imprecise trap condition as detected by the verification system of FIG. 1.

FIG. 13 is a diagram of two instruction streams which lead to an imprecise trap write condition as detected by the verification system of FIG. 1.

DETAILED DESCRIPTION OF THE PREFERRED EMBODIMENT

Figure 1:
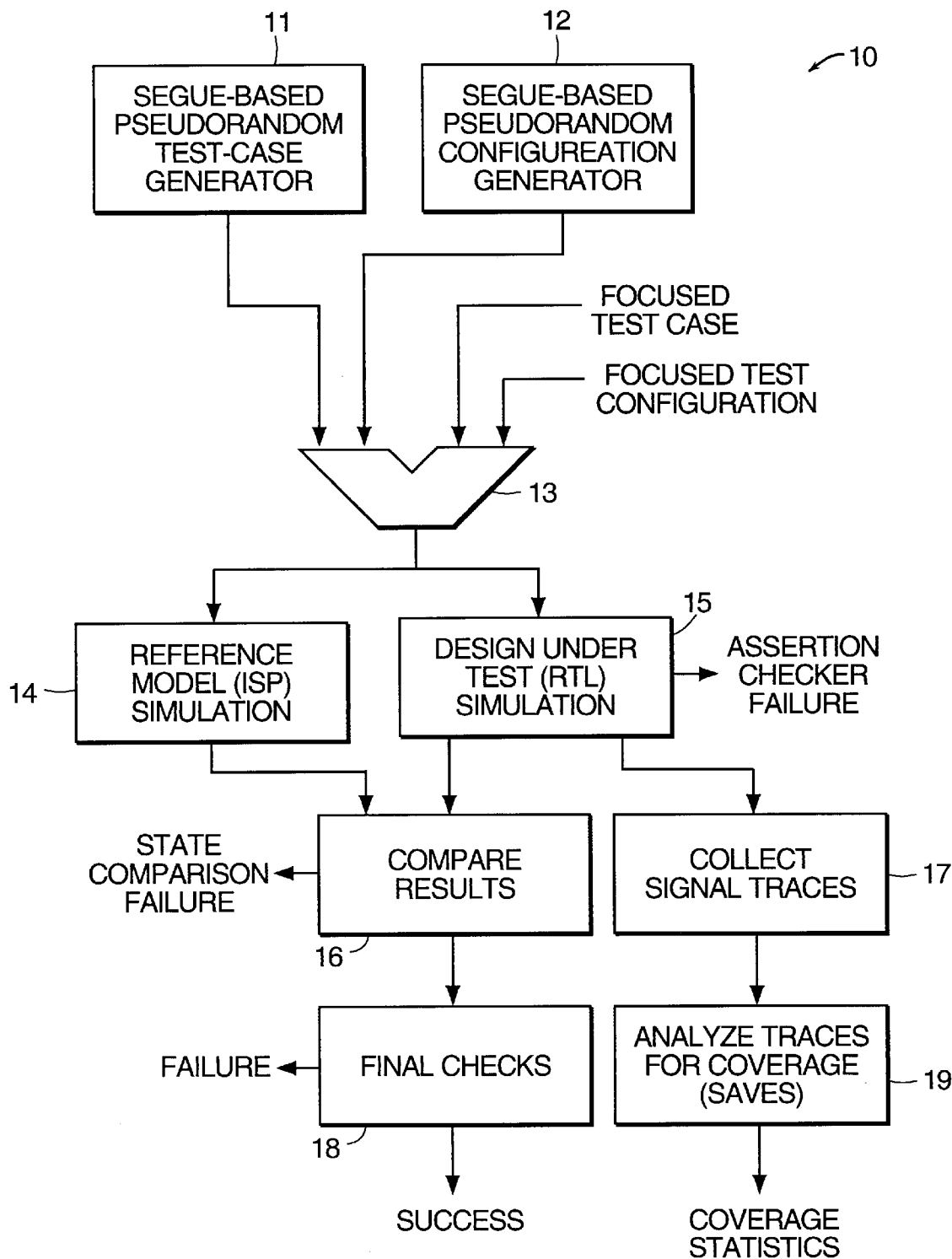
FIG. 1 is a block diagram of a design verification system for a CPU chip or module.

Referring now to FIG. 1, design verification system 10 is shown to include, inter alia, pseudo-random test case generator 11, pseudo-random configuration generator 12, and test file generator 13. Design verification system 10 also includes a reference model 14 which according to the preferred embodiment of the present invention, is a very high level abstraction of the Alpha architecture written in the C programming language. In general, the reference model is a high level abstraction of the design which is to undergo testing. Design verification system 10 also includes a device under test 15 which is a model of the actual design being tested or could actually be a finished device under test. Also included in design verification system 10 is a results comparator 16, a signal trace collector 17, as well as a final check stage 18 and trace analyzing stage 19.

In order to verify a particular CPU or circuit design, the first step is to generate a pseudo random test case using pseudo random test case generator 11. Here, pseudo random test case generator is based on the Segue generation tool widely used by Digital Equipment Corporation. For a more detailed description of the Segue tool, see co-pending patent application titled "Method and Apparatus for Test Data Generation" filed on even date herewith. According to the preferred embodiment, the test case generator, also known as an exerciser, creates pseudo random assembly language code, which when applied to a device under test, would exercise the functionality of the device under test. Along with the test case generator, a configuration generator 12 also based on the Segue tool is used to construct so-called configuration control block parameter file (CCB). The CCB is used to set up the type of system that would be emulated for a given simulation. The parameter file consists of variables that could be weighted to make certain system events occur or to cause certain configurations to be chosen. Examples of the types of events that could be chosen are single bit error correcting code errors, interrupts, the presence of an external cache, the ratio between the system clock and the CPU internal clock rate, cache size and configuration, as well as other bus interfacing timing events. Once a configuration file is chosen, using the parameter file, it is then processed to produce two files which were used in the simulation. The first file is a control file used to set up internal state for the pseudo system level model while the second file is loaded into the memory model (i.e. the reference model) to be used by the verification system and to provide information accessible through assembly code regarding the configuration type.

Once the pseudo random code in configuration has been generated, this test information is loaded into the device under test 15 and into the reference model 14 to be used as the stimulus. Once loaded, simulation begins. For each simulation run, the reference model 14 and the DUT 15 produce a file which includes information regarding every operation which has been performed by the model. The file is essentially a list in column form where each row entry includes a value for the program counter, opcode value, trap information, so-called special information, and the results of the executed instruction. Here the special information may include memory operation, information such as the address of a memory operation and the size of the block of data for the memory operation. For the device under test, that is the model, this special information may include a so-called lock flag unpredictable indicator, a warning of a machine check indicator and a hardware interrupt warning indicator. As will be discussed below, this information is used during the results comparison to determine if a device under test operates according to the reference model standard.

According to the present invention, a method of comparing the output of the reference model and a design under test is provided which allows a detailed comparison and design verification for imprecise architecture designs. Generally, the method includes extracting architectural state from the design under test, as well as the reference model during the simulation and using the captured state to compare the output of each one. As stated above, the captured state generally includes the results of all instructions including the program counter (PC) flow, trapping information, etc. The comparison is performed on an instruction by instruction basis which yields a very detailed comparison when the comparison process is complete. During the comparison process, if a miscompare is found, a detailed error message is provided describing the nature and location of the problem.

Figure 2:
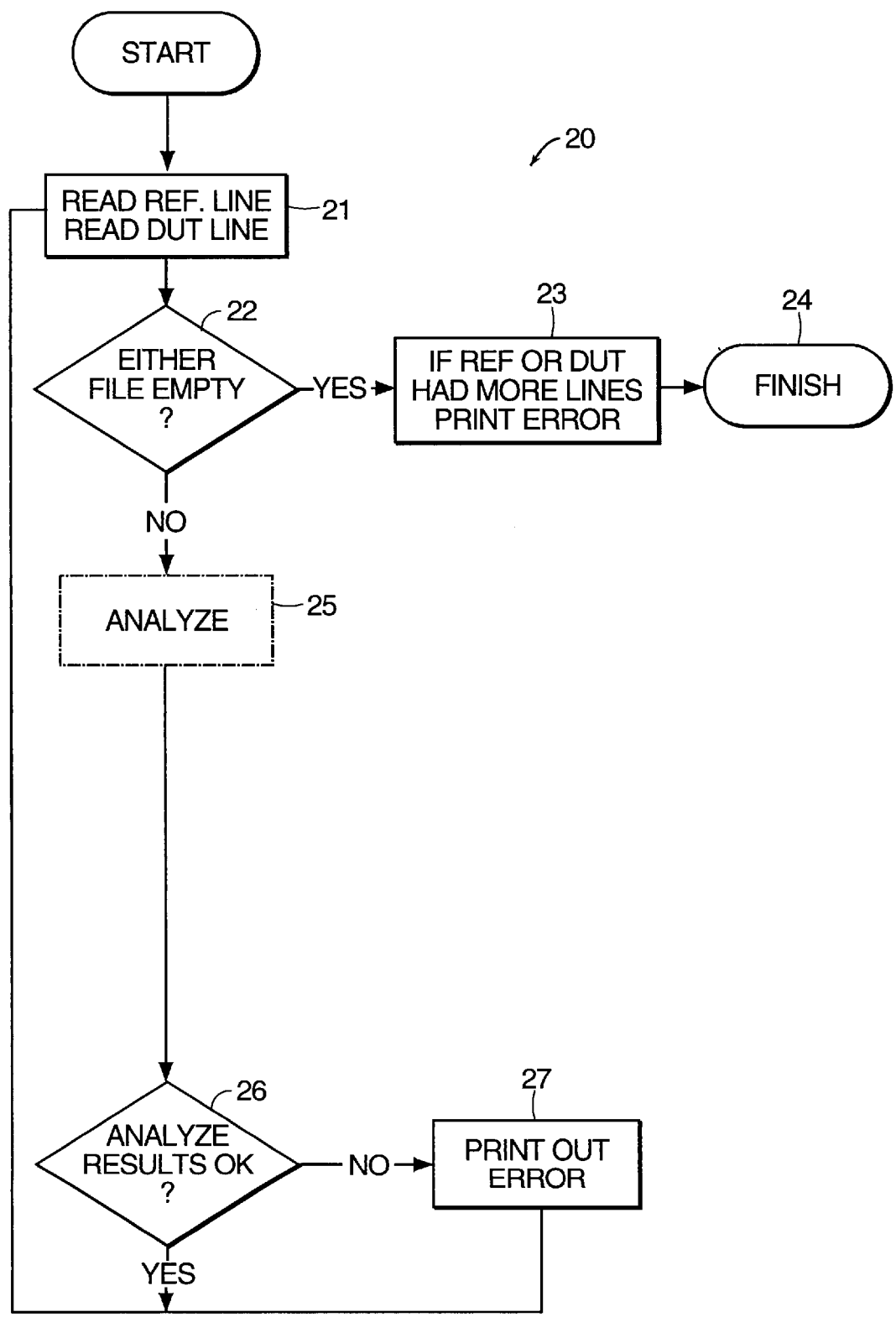
FIG. 2 is a flow chart for the basic operation of the result comparator of the verification system of FIG. 1.

Referring now to FIG. 2 the basic operation of the comparator 16 of verification system 10 (FIG. 1) is represented by flowchart 20. Processing begins at step 21 with a entry line being read from the reference model trace file and the DUT trace file. If the read step 21 had resulted in one of the files being empty (i.e. out of trace entries) as tested in step 22, then processing moves to step 23 where an error is printed if there are still trace entries in the other file. This condition is an error since a properly run verification should result in both trace files being exhausted of entries at the same point. If both reads of the trace file were successful (i.e. both files were not empty), then the process proceeds to step 25. Step 25 includes detailed analysis of the trace lines and will be discussed in more detail below. The results of the analyze step 25 are checked in step 26 with any errors being reported in step 27. From either step 26 or 27, processing returns to step 21 where new trace lines are read in for comparison. The process of flowchart 20 continues until the trace files are exhausted.

Figure 3A:
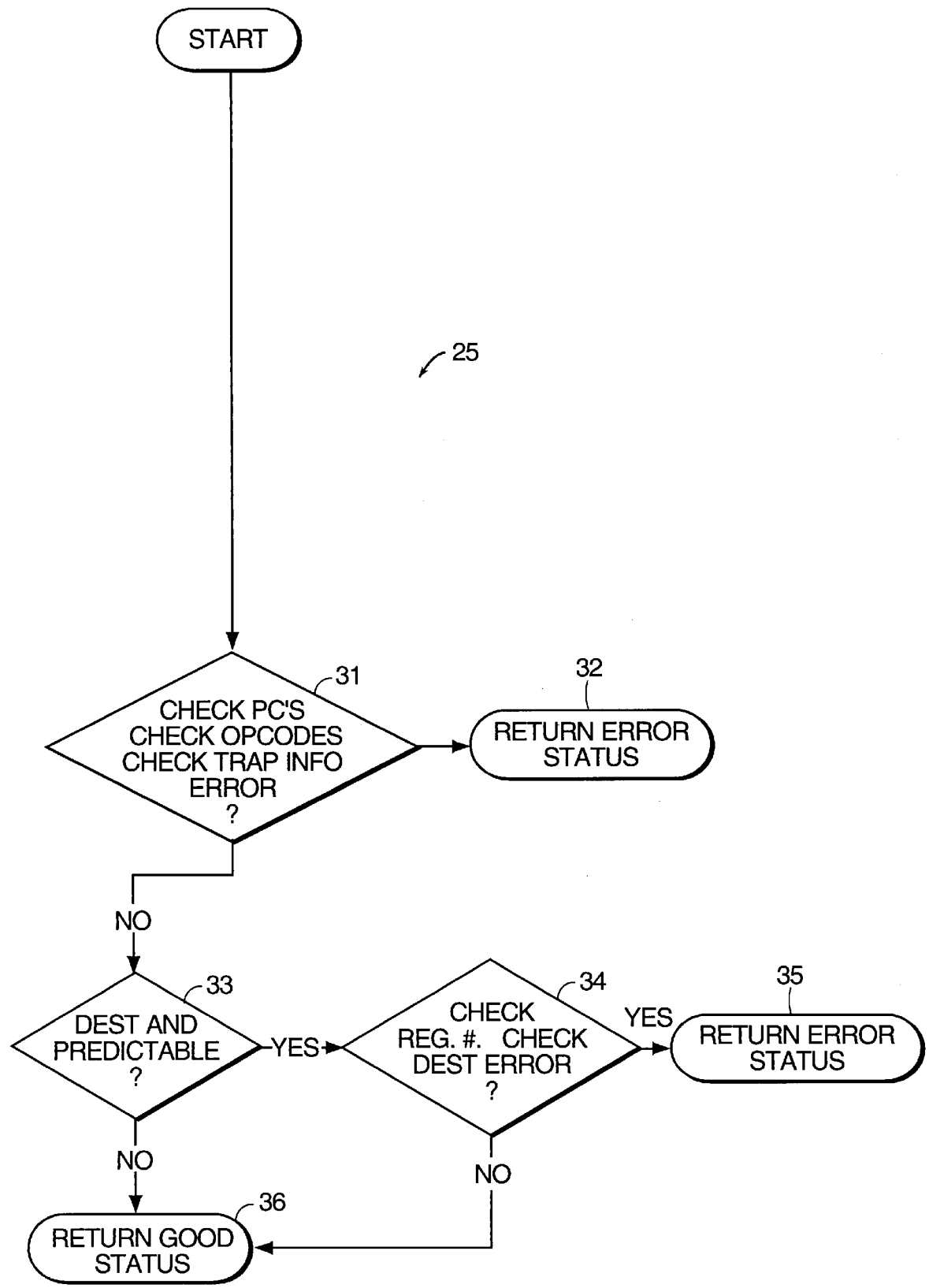
FIGS. 3A and 3B are flow diagrams showing more detailed operation of the analyze process of the flowchart of FIG. 2.

Referring now to FIG. 3A, the analyze step 25 of FIG. 2 is shown in more detail. Analysis of the trace lines begins at step 31 where the PC values, Opcode values, and trap information for the respective trace lines is compared. If a mismatch is detected, processing moves to step 32 where the error status is returned (to step 26 of FIG. 1) with processing of the current trace lines ends. The process then returns to step 26 of FIG. 1.

If however there is no error from the step 31 comparison, processing moves to step 33. Here each trace line is checked to see if it is an instruction which is of the type that includes a destination (i.e. register location) and whether the destinations are predictable. Predictability is actually determined prior to step 33 and will be discussed in more detail below. If the trace lines of the type which include a destination and the destination is predictable, processing moves to step 34 where the destination values of each trace line are compared. If there is a mismatch, processing moves to step 35 where the error is returned and the process returning to step 26 of FIG. 2. If however the trace lines include instructions that are not of the type which include a destination, processing moves to step 36 where a good status is returned. The process then returns to step 26 of FIG. 2.

Figure 3B:
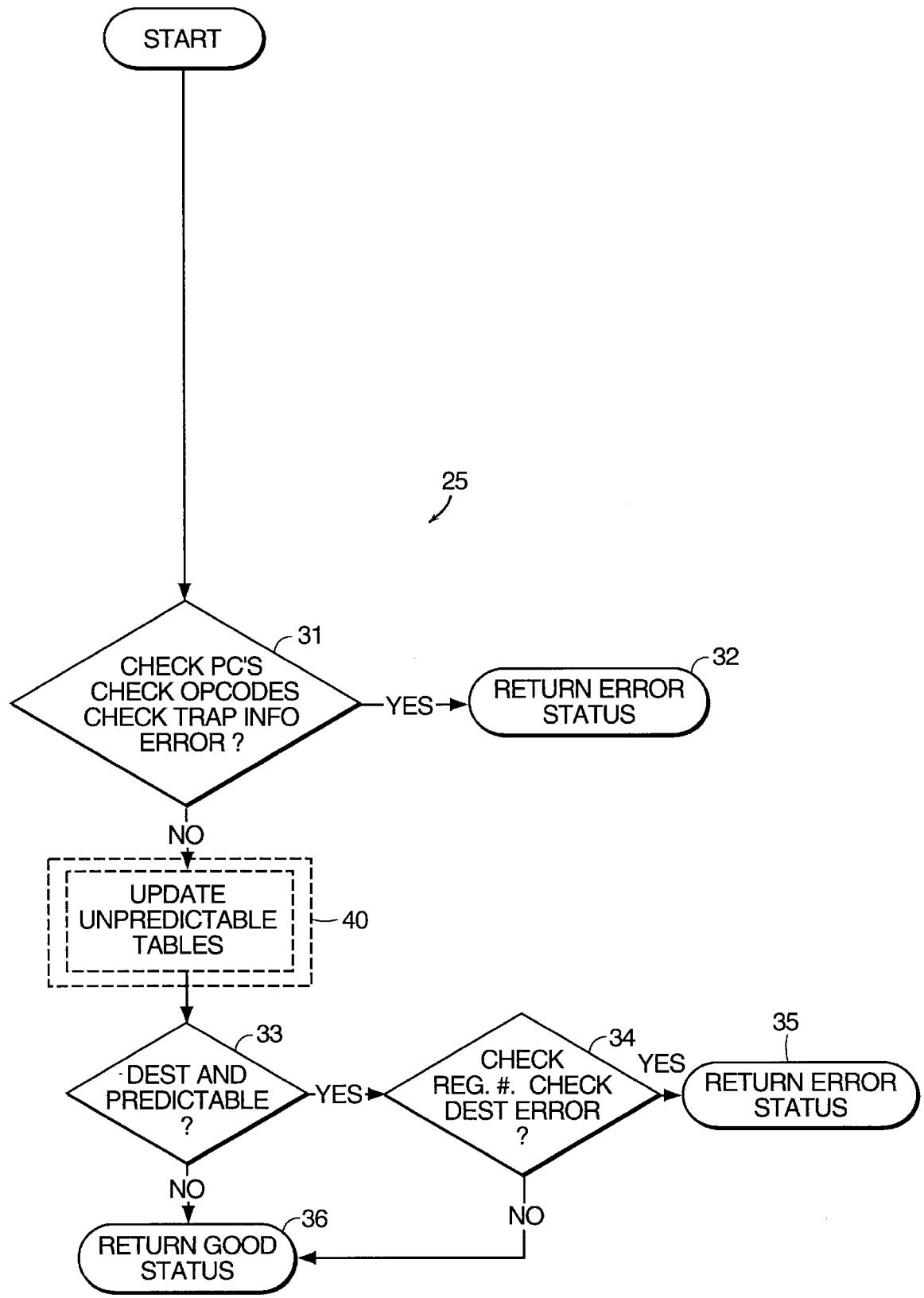

Referring now to FIG. 3B the verification process of flowchart 20 is shown to further include process step 40. Step 40 is the portion of the process where the so called "unpredictableness" of the trace entry or associated data is determined and updated. Note that FIG. 3B is similar to FIG. 3A with the insertion of step 40. Conceptually, unpredictability occurs when results or data cannot be compared against the reference model with certainty because mismatches do not always indicate errors. The imprecise nature of the DUT architecture may produce a different value from the reference model at the same trace point but this mismatch may not be an actual processing error. Thus the mismatch should be allowed by the verification process.

As described above, the comparison process is made extremely difficult when unpredictable data can appear and propagate in an imprecise architecture such as the Alpha Microprocessor Architecture. The method of the present invention uniquely handles this by detecting when a result in unpredictable and does not use it in the comparison.

Some examples of unpredictable event causing situations can be thought of as falling into the six categories listed below.

(1) Architecturally unpredictable results from an instruction (e.g. floating point instruction);
(2) Results unrepresentable in the reference model (e.g. a cycle count instruction);
(3) Unpredictable data in the DUT status registers;
(4) An undefined opcode simulation;
(5) Imprecise trap timings between the device under test and the reference model; and
(6) Random system events on the device under tests pin inputs.

An architecturally unpredictable result from an instruction is determined by the reference model during execution. That is, the reference model has knowledge of what types of instructions, due to the design architecture, will cause an predictable results. For example, a floating point instruction that results in an overflow trap produces an unpredictable result.

Unrepresentable results in the reference model results when the reference model attempts to read and use data that has no meaning to it but does have meaning to the DUT. For example, the concept of clock timing is irrelevant to the reference model since it simple executes instructions as it receives them. The DUT on the other hand operates as a functioning circuit an is dependent on clock timing. Thus if the reference model were to execute a cycle count instruction it would produce meaningless results.

Unpredictable data in the DUT status registers occurs when for example, outside system traffic causes some status register values to change. Since the reference model is typically a stand alone entity (i.e. no associated system), it will not experience the same event and thus the status registers will not be effected.

Imprecise trap timings occur due to the fact that the reference model executes its trap routines immediately after execution of the instruction which caused the trap. The DUT on the other hand may not execute the trap routine until several instruction cycles later. Thus trace file differences occur but should not be flagged as errors.

Random system events at the DUT I/O pins cause unpredictable results for similar reasons as the unrepresentable data problem. That is the reference model has no system interface an thus is not exposed to the random system events. Here again the mismatch in trace files need to be tracked and not necessarily reported as an error.

According to the present invention, during analysis, the unpredictable status of certain registers, memory, and other miscellaneous flags are tracked. In the preferred embodiment the tracked information includes integer registers, floating registers, privileged internal registers, memory, and internal chip (status) flags.

The information described above is tracked using data structures which provides a means of storing the unpredictable status of each of the above mentioned items. These data structures are global to the verification process.

Figure 4:
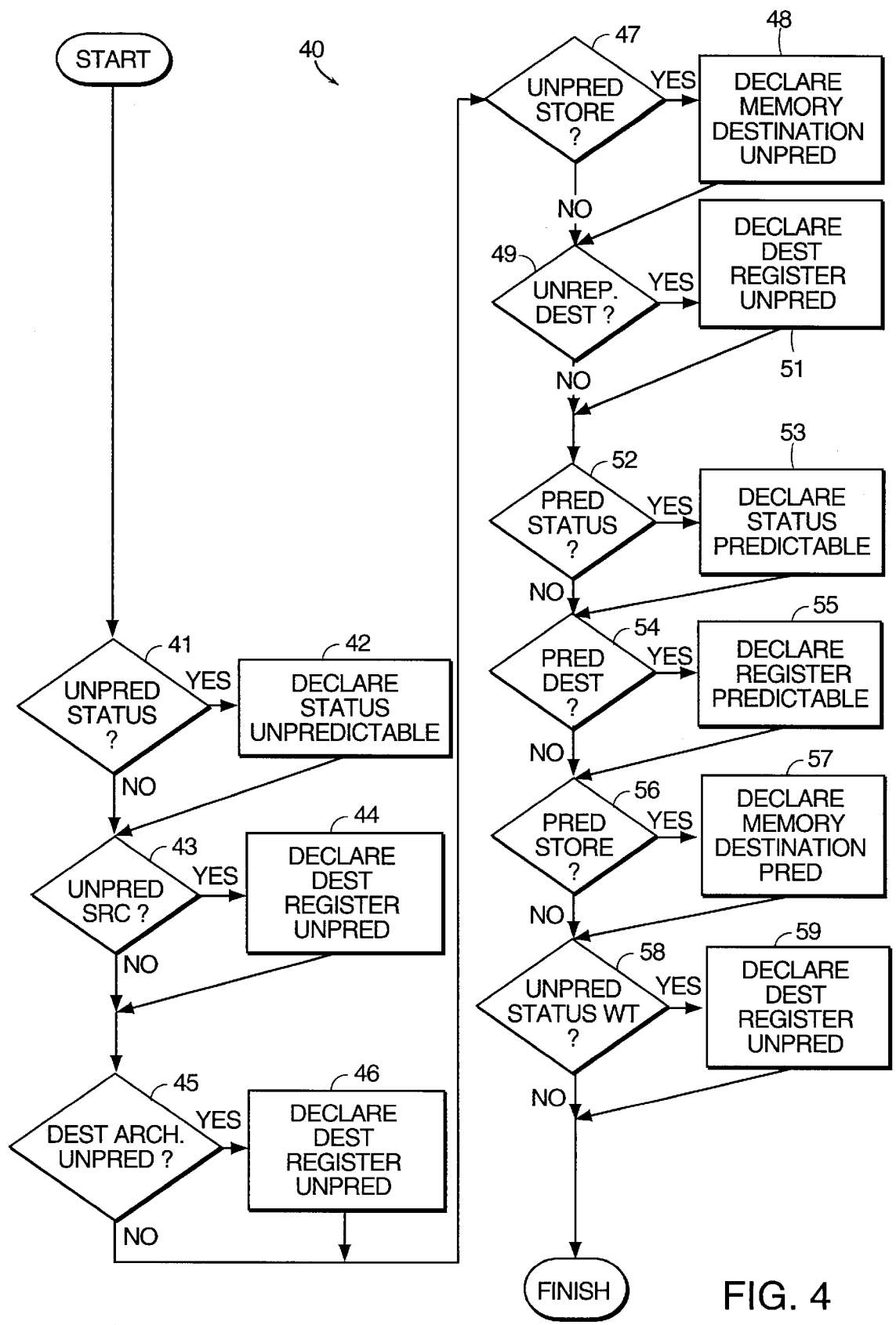
FIG. 4 is a detailed flow diagram for the operation of the update unpredictable process step of FIG. 3B.

Referring now to FIG. 4 the general process for determining the presence of unpredictable data/events as described above will be discussed. Generally the process of flowchart 40 is used to update the contents of the data structures described above. Starting at step 41 the unpredictable status of the current trace line is checked. This is accomplished by checking each internal chip flag status against a set of known rules that may make a status flag unpredictable. If true then the status flag is set as unpredictable (i.e. step 42). In general the rules are built into the verification process and are architecturally dependent. For example for the Alpha Microprocessors manufactured by Digital Equipment Corporations, if the source of the instruction is unpredictable and it is known that the current instruction will cause a trap the status flags associated with traps will then be declared unpredictable.

Processing then moves to step 43 where a check is performed at see if the trace line is executing an instruction using unpredictable source operand (i.e. an operand previously set as unpredictable). The operand may be register or memory data. If the instruction does use an unpredictable source operand then the destination of the instruction is marked (i.e. the data structure is updated) as being unpredictable as indicated in step 44.

Processing next moves to step 45 where the trace line (here the from reference model) is examined to determine if the instruction is unpredictable because of architectural considerations (discussed above). If the destination of the instruction is unpredictable, as told by the reference model, then the destination register is marked (i.e. the data structure is updated) as being unpredictable as indicated in step 46.

Processing moves then to step 47 where the trace line is examined to determine if it is a store instruction which includes an unpredictable source operand. If there is an unpredictable source operand being used, then, in step 48, the memory destination is set as being unpredictable.

The next processing step, step 49, includes a determination whether the trace line includes information supplied by the reference model that the current destination data is unrepresentable (as described above), and therefore is unpredictable. In this case the destination is marked as being unpredictable (step 51).

Processing next moves to step 52 where the status flags of the current trace line is checked as in step 41. Here however this is accomplished by checking each internal chip flag status against a set of known rules that may make a status flag predictable. If true then the status flag is set as predictable (i.e. step 53). Note: A flag previously marked as unpredictable will can not be immediately marked predictable since the two sets of rules (described above) are mutually exclusive. This holds true for all unpredictable/predictable status updates.

The next step, 54, involves checking the trace line instruction to determine if the destination register, marked unpredictable during a previous iteration of flowchart 40, is now predictable. If the destination is predictable (i.e. all source operands are predictable, and is architecturally predictable, and is representable) then the destination register is declared as being predictable.

Processing then moves to step 56 where the trace line is examined to determine if a store instruction includes a predictable source. If it does, then the memory destination is set as being predictable.

At step 58 a test is done to determine if the trace line includes an instruction which includes a status flag as an operand which is unpredictable. If it is then the destination register of the instruction is set as being unpredictable. Processing then returns to flowchart 25 as step 33.

During trace file analysis, due to the imprecise nature of the DUT, the two trace files may no longer be executing the same instructions at the same time. In order to handle this situation, the present invention provides method of continuing analysis until the files match again.

Figure 5:
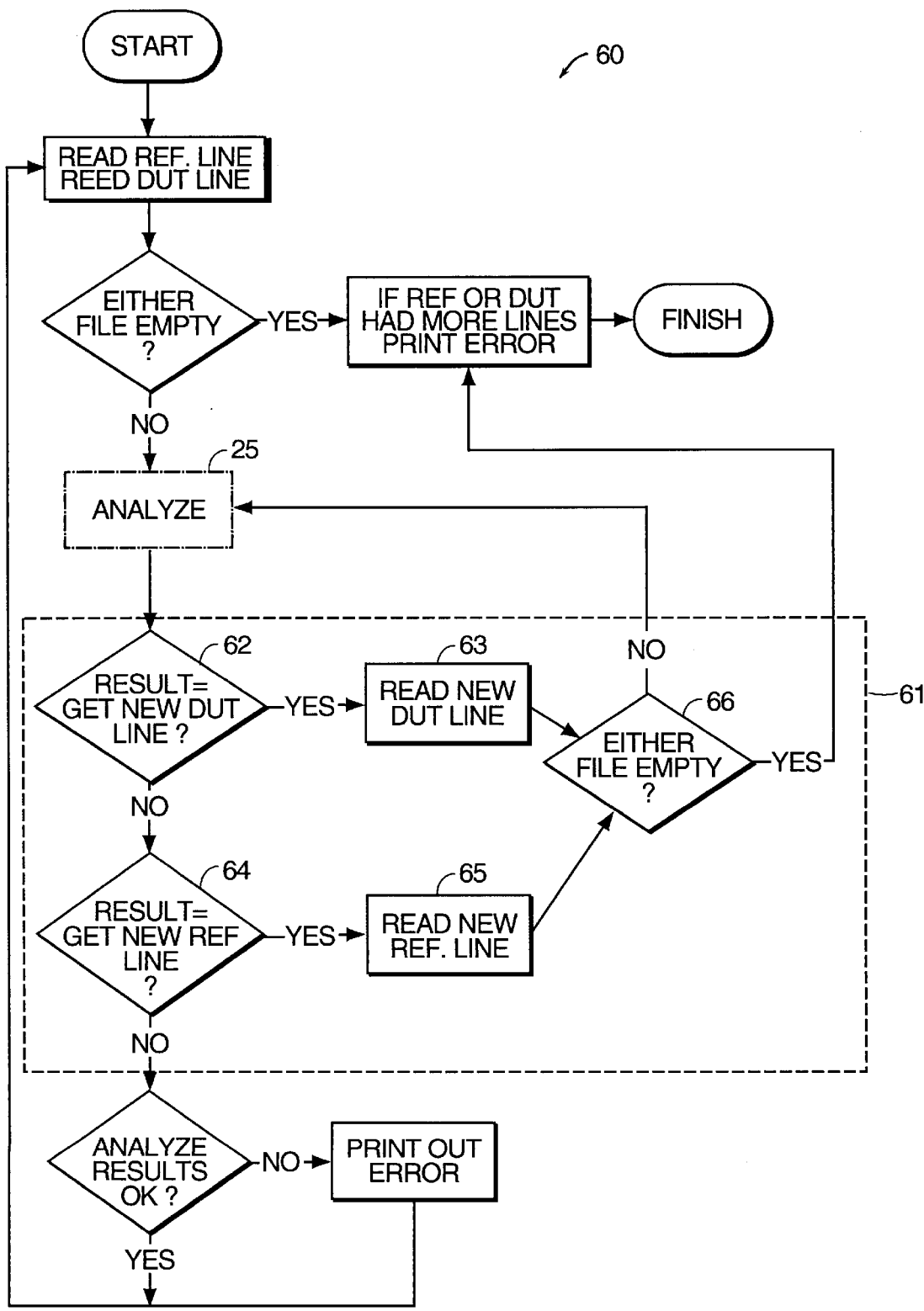
FIG. 5 is a flow diagram for the operation of the verification system of FIG. 1 in response to a mismatch in trace file entries for the DUT and reference model.

Referring now to FIG. 5, the mismatched file processing is shown as flowchart 60. Note that flowchart 60 is similar to flowchart 2, with the addition of this processing capability. The additionally processing capability is shown as functional block 61, indicated by the dashed lines. As will be discussed below, the analyze function includes the ability to process imprecise trap timings. As a result of that processing, the analyze function will return one of two conditions. The first is indicated by steps 62 and 63 where the analyze function returns the "get new DUT trace line" condition. The second is indicated by steps 64 and 65 where analyze returns the "get new reference model trace line" condition. For each flow, the process reads the next line for the individual trace file (i.e. the DUT trace file or the reference model trace file). Processing then returns to step 25 (i.e. the analyze function). This process continues until the analyze function detects that the trace files have been resynchronized.

Figure 6:
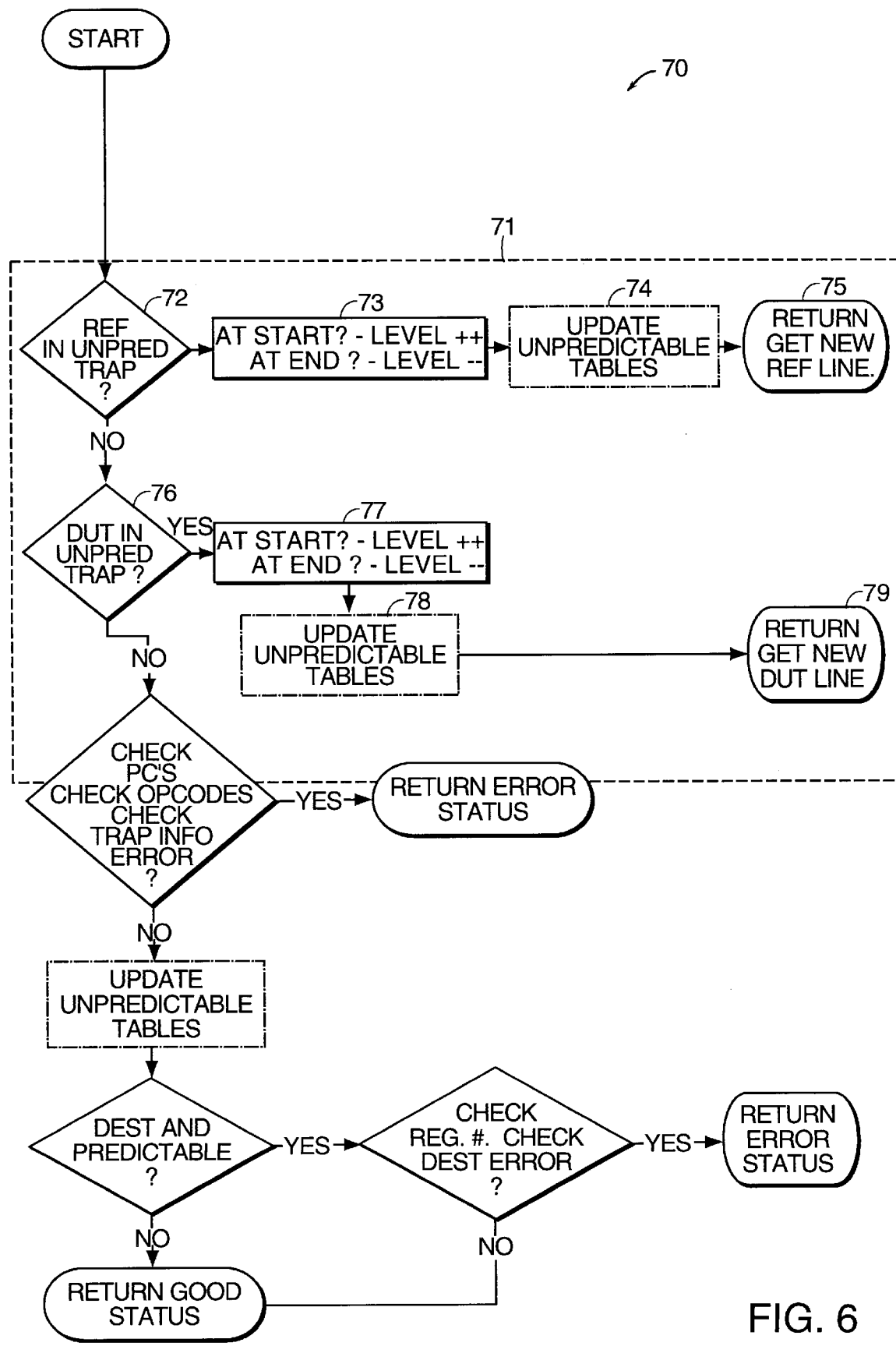
FIG. 6 is a flow diagram showing the operation of the verification system of FIG. 1 in response to an unpredictable trap occurring in either the DUT or the reference model trace file.

The procedure for handling unpredictable traps will now be discussed in connection with FIG. 6. Flowchart 70 of FIG. 6 shows the additional functionality of the analyze function 25 (FIG. 2) The additional functionality is shown as block 71 and is enclosed by dashed lines. During the analysis of each trace line, a check is performed as indicated in step 72 to determine if the reference model is currently in an unpredictable trap state (i.e. a trap which does not match the current operation of the DUT). If it is in an unpredictable trap state, then processing moves to step 73. If the at step 73 the unpredictable trap is just beginning, a trap level indicator is incremented or if the unpredictable trap is ending, the trap level indicator is decremented, else, processing moves to step 74 where the global data structure is updated with unpredictable status. The particulars of the operation of step 74 (and 78) will be discussed below. After the data structure has been updated, the analyze function returns a "get new model reference trace line" condition.

Similarly, if the reference model is not in an unpredictable trap but the DUT is, processing follows steps 77–79. The processing is essentially equivalent with the corresponding status bits in the global data structure being set. At step 79 a "get new DUT trace line" is returned. The remainder of steps in FIG. 6 have been described previously in connection with FIG. 3A. It can be seen then that the unpredictable trap routine of either trace file is processed in its entirety before the next respective trace lines of the trace files are compared. In this way, procedural timing differences do not preclude the comparison testing as with prior art systems. While processing past the unpredictable trap other traps may be encountered leading to a nested trap condition. The leveling count is used to distinguish a return instruction associated with a nested trap routine from the highest level trap routine. This distinction is needed to notify the verification process when the top level trap has ended and the normal instruction comparison can resume (i.e. trace file lines resynchronized).

Figure 7:
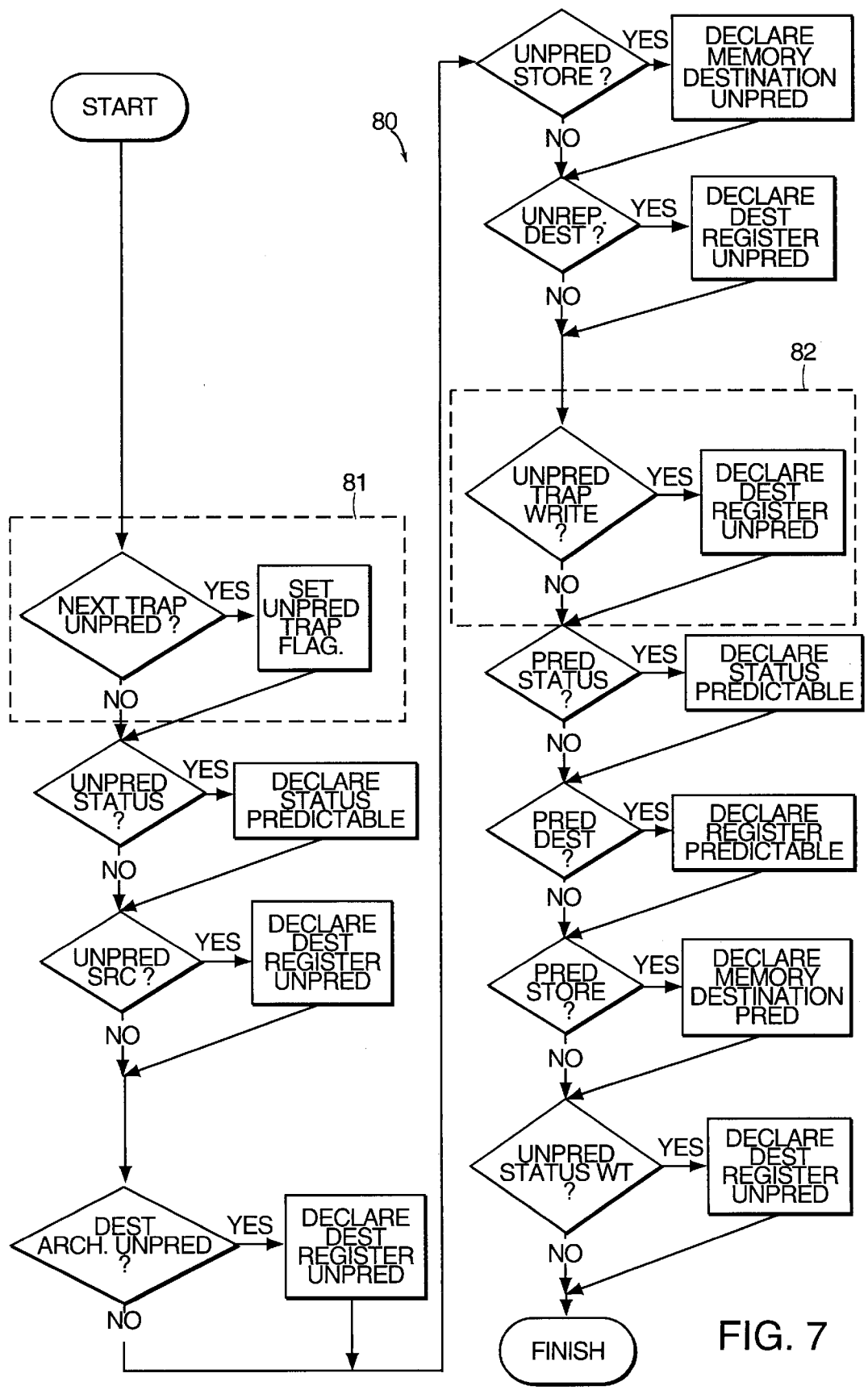
FIG. 7 is a flow diagram for the update unpredictable process of the flowchart of FIG. 6.

Referring now to FIG. 7, the update unpredictable tables (i.e. step 74 and 78 of FIG. 6) process, indicated as flowchart 80, will now be discussed in more detail. FIG. 7 is essentially the same flowchart of FIG. 4 with the addition of steps 81 and 82. Rather than repeat the discussion of the process of the similar steps, the reader should refer to the discussion associated with FIG. 4 as presented above. It should be noted however that each of the steps of flowchart 80 is performed during steps 74 and 78 of flowchart 70 (FIG. 6). At step 81, a flag is set which indicates that the current trace line being analyzed contains an instruction which will cause an unpredictable trap sometime in the future. For the reference model the trap will occur immediately following the instruction whereas the DUT may not execute the trap routine until several instruction cycles later. An unpredictable trap is caused by an instruction that the trace line indicates will definitely cause a trap and included an unpredictable source operand or the instruction itself is an undefined operation (described earlier). Additionally, an unpredictable trap condition occurs when one trace file indicates processing of a trap routine while the other trace file does not. In either case the trap instructions are being ignored (i.e. no comparison) as indicated by flowchart 70 (FIG. 6).

While the trap routines are being ignored, there is still a monitoring process (i.e. step 82) which checks to see if any of the trap routine instructions are attempting to write a register. If they do then the destination registers are flagged (in the global data structures) as being unpredictable. It should be noted that monitoring for other writes could be done also (e.g. memory) and thus the monitoring for register writes only in the preferred embodiment should not be considered as a limitation of the present invention.

Figure 8:
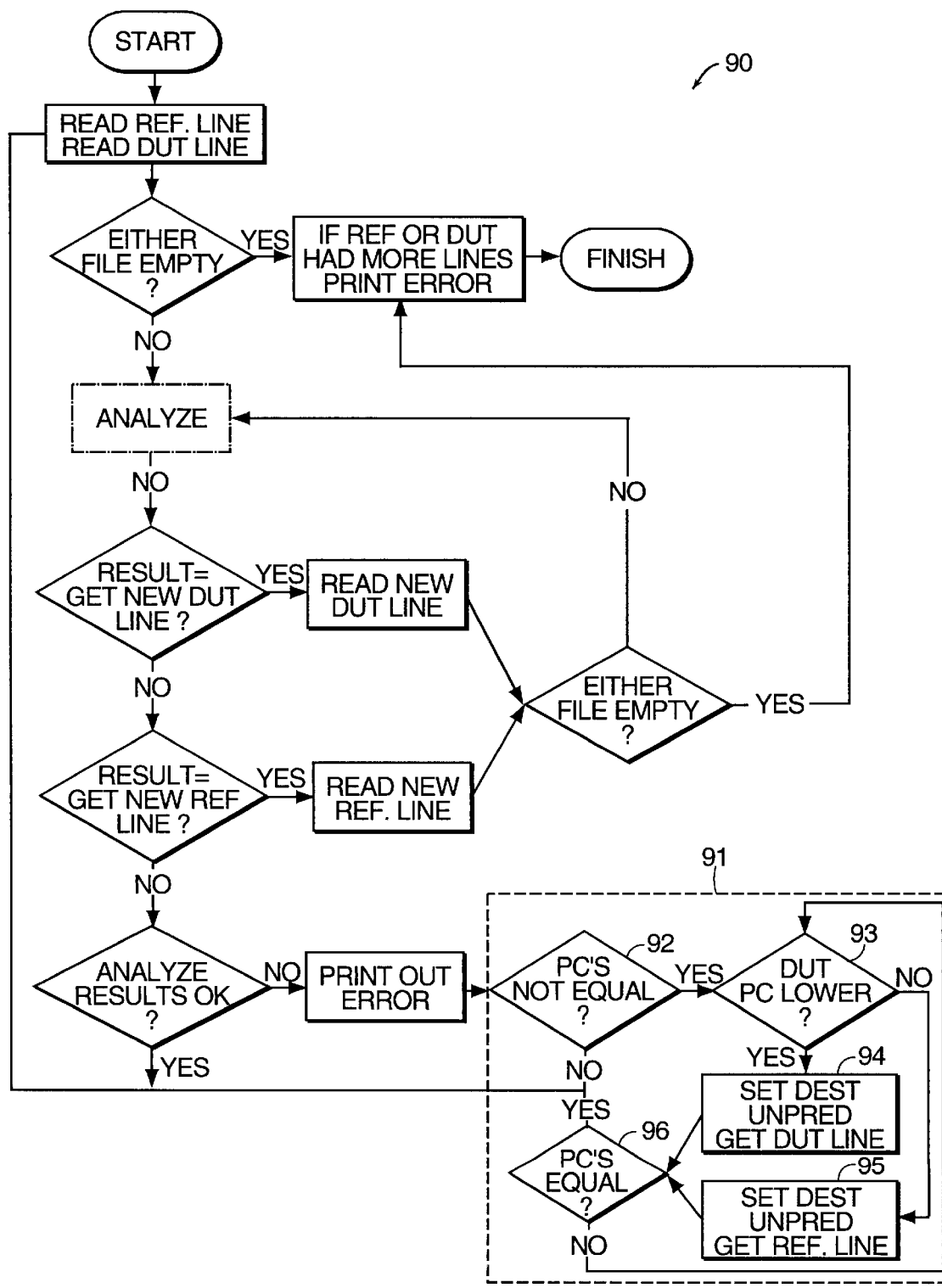
FIG. 8 is flow diagram showing the operation of the verification system of FIG. 1 in order to resynchronize the program counters.

Referring now FIG. 8 flowchart 80 shows the process used to resynchronize the PC values (i.e. the trace files) for the reference model and the DUT. This flow is used when the PC values become unsynchronized due to PC miscomparison errors or branch instructions whose source operands have been flagged as unpredictable. In either case it is still desirable to compare beyond the point where the PC values become unsynchronized. Flowchart 90 is similar to flowchart 60 (FIG. 5) with the addition of process block 91 which handles the PC synchronization problem. Generally, the process involves continuing to read a trace line from the file with the lower PC value until the PC values are resynchronized. Additionally, each instruction read from the trace file with the lower PC value has its destination flagged as unpredictable. This is indicated in the flow through steps 93–96.

Referring now to FIG. 9, an example of two instruction execution streams illustrating an imprecise trap condition are shown to include several floating point instructions and the occurrence of a trap. Instruction stream 110 corresponds to instructions executed by the reference model while instruction stream 120 corresponds to instructions executed by the DUT. In each stream the program counter (PC) values are the same until execution proceeds past PC value 2. Here, the floating point instruction at PC 2 causes a trap to occur. As described above, the reference model executes its trap routines immediately following the instruction causing the trap condition. Thus as shown in block 112, the PC value jumps the location of the trap routine and execution continues from that point. In the example, the trap routine is located at PC value 100 and includes p instructions.

Although the DUT executes the same trap causing instruction as the reference model and at the same time, the DUT continues to execute other floating point instructions up to PC value 4 before it actually handles the trap condition. This situation occurs because of the DUT's imprecise architecture. That is, the DUT does not require that a trap be executed immediately after the trap causing instruction. This type of design may be used to enhance processor performance. Thus, the trap routine for the DUT, although the same as executed by the reference model, is not executed until after the instruction at PC value 4 as indicated by block 122. This condition leads to a disparity between the two associated trace files processed by the verification system.

Figure 10:
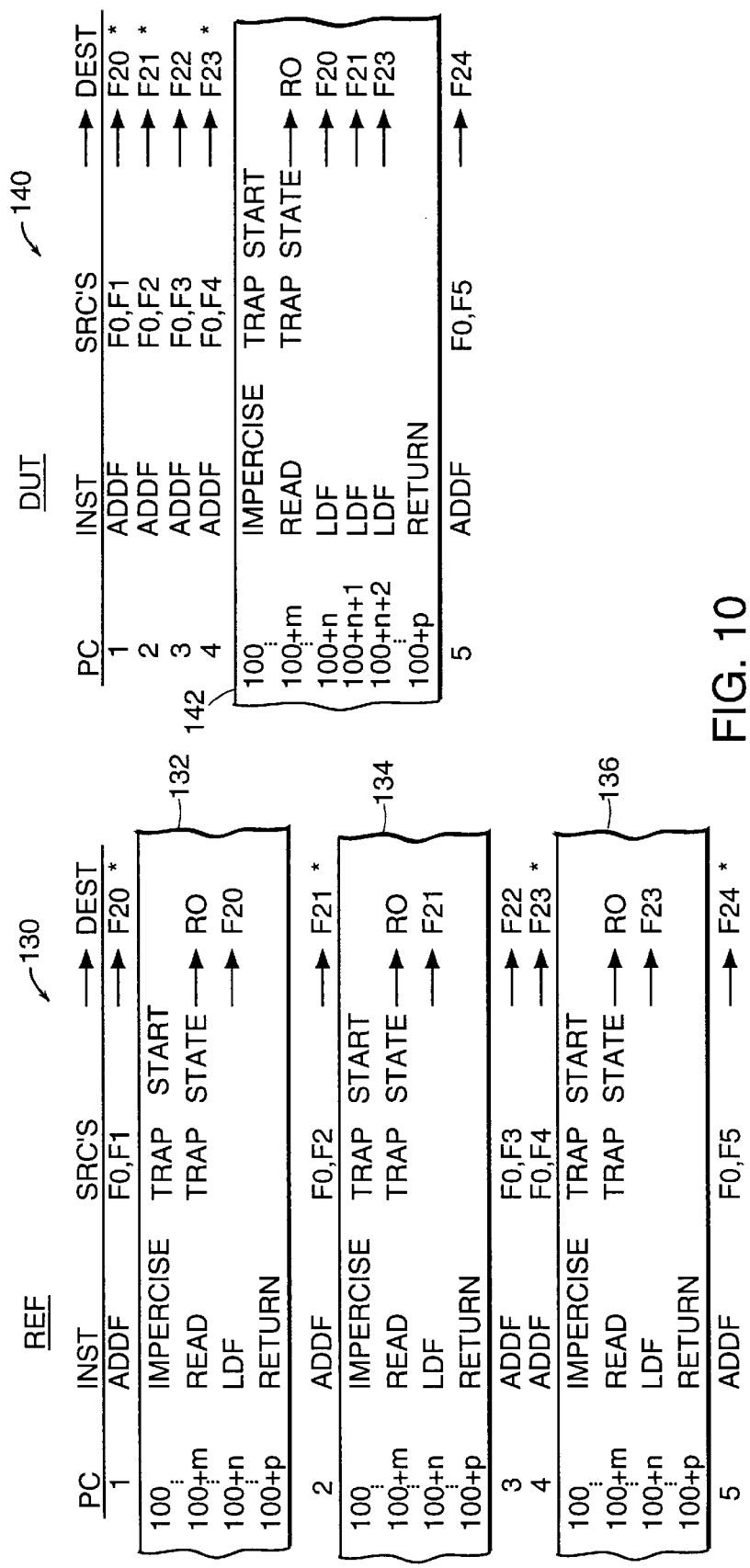
FIG. 10 is a diagram of two instruction streams which lead to a condition including multiple imprecise traps as detected by the verification system of FIG. 1.

A further complication arises when the multiple traps occur in the reference model prior to the execution of the any of the trap routines in the DUT. This condition is illustrated in FIG. 10. Again, floating point instruction streams 130 and 140 are shown for the reference model and the DUT respectively. The instruction at PC value 1 of the stream 130 causes a trap which executed immediately by the reference model as shown by block 132. As before, the DUT continues executing instructions prior to executing the trap routine. In this example however the next instruction (PC value 2) also causes a trap and will similarly cause a trap in the reference model but not until the previous trap routine has been executed.

The DUT however continues to execute instructions and encounters yet another trap causing instruction at PC value 4. Unlike the DUT execution stream, reference model stream 130 will not execute the instruction at PC value 4 until it has processed the trap associated with the trap causing instruction at PC value 2. Unlike the reference model, the DUT architecture allows for the combining of trap routines. Therefore after executing the instruction at PC value 4, the DUT finally reaches a point were it will actually execute the trap routines. As indicated in block 142, the outstanding trap routines are combines and executed as a single trap routine. Thus it is not until each stream reaches the execution of PC value 5 that the trace files will be in synch again.

The present invention continues to process the trace files tracking the write operations which occur in the trap routines of the reference model until the DUT trace file reaches the point where the trap routines are combined and executed. Note however that the instructions at PC values 2, 3, and 4 of each trace file are compared in detail as normal. Simply stated, for the instruction streams of FIG. 10 starts with a compare of PC value 1. Then processing of the reference model trace file proceeds, moving past trap routine 132 until PC value 2, while there is no processing of the DUT trace file. When processing of the reference model trace file reaches PC value 2, the instruction at PC value 2 of the DUT is compared. Processing of the DUT trace file waits again until processing of the reference model trace file reaches PC value 3 where it is then compared against the DUT. This process continues until the processing of the DUT trap routine occurs at which time processing of the reference model trace file ceases until the DUT trap routine completes. At this point the trace files are back in synch at PC value 5.

Figure 11:
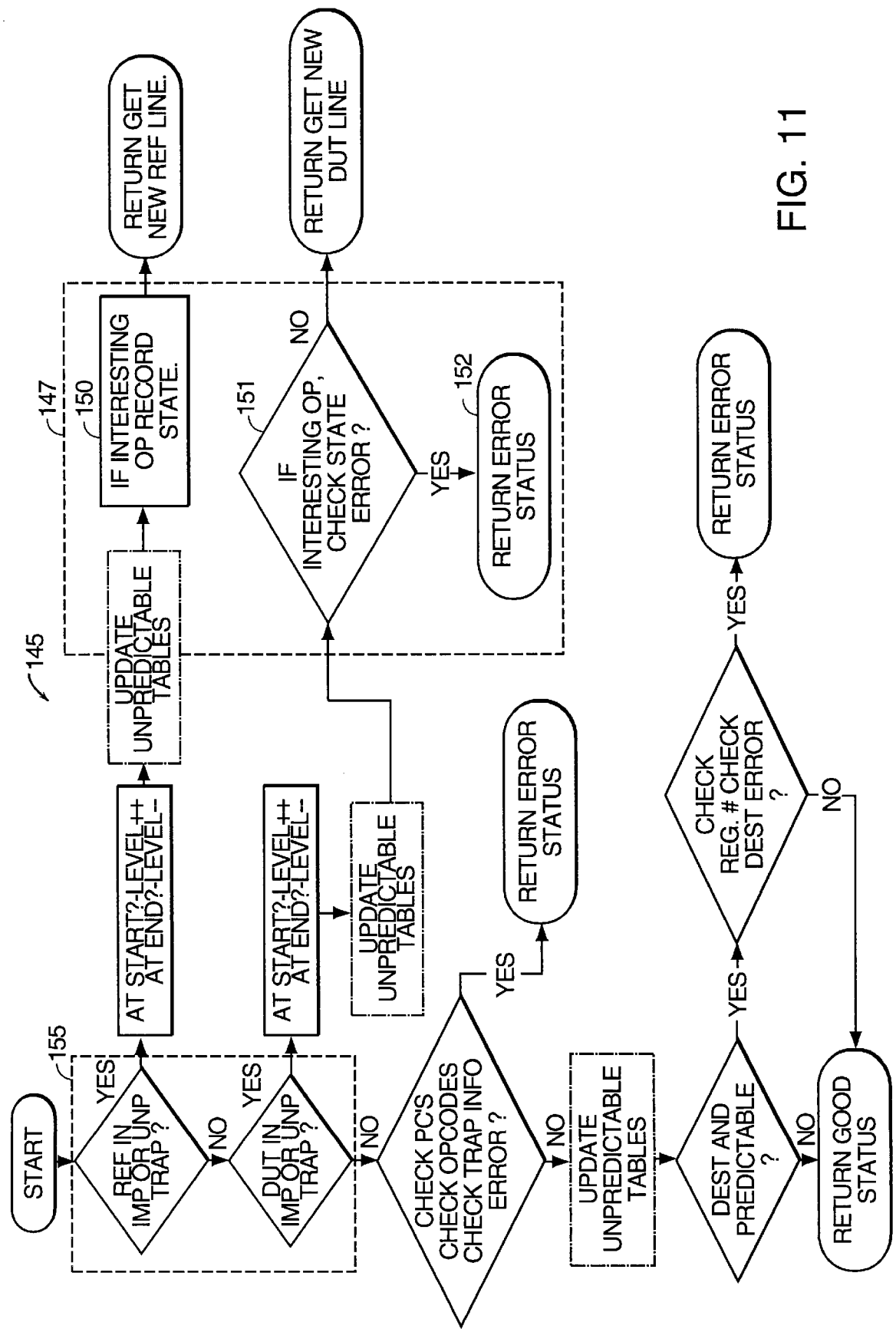
FIG. 11 is a flow diagram of the of the operation of the verification system of FIG. 1 to detect and handle the imprecise trap conditions illustrated in FIGS. 9 and 10.

The process for comparing imprecise traps and multiple traps is illustrated in flowchart 145 of FIG. 11. Note that flowchart 145 is similar to flowchart 70 (FIG. 6) with the addition of process block 147 and the additional check for imprecise traps in process block 155. That is, rather than just processing past the trap as in the case of an unpredictable trap, the instructions within the trap routine are also analyzed. Thus, as shown in FIG. 11, the addition of steps provide for the analysis of the individual trap instructions. In particular, if the analysis is processing a trap within the reference model trace file, step 150 will be reached. Here any interesting operations cause the state of the trap routine to be recorded. In the preferred embodiment, an interesting condition would be the "read trap state" instruction at, for example, PC value 100+m.

On the other hand, if the analysis is processing a trap routine in the DUT, an interesting operation ("read trap state") requires that the state of the trap (as recorded in step 150), for one or more traps executed by the reference model, be combined and then compared against the DUT trap state. An error is returned (step 152) if there is a mismatch. The reason that this indicates an error is that the reference model always executes the trap routines before the DUT since the reference model operates according to precise timing. Thus, by the time the DUT reaches the same instruction the trap states should match. If they do not match then an error is returned.

Figure 12:
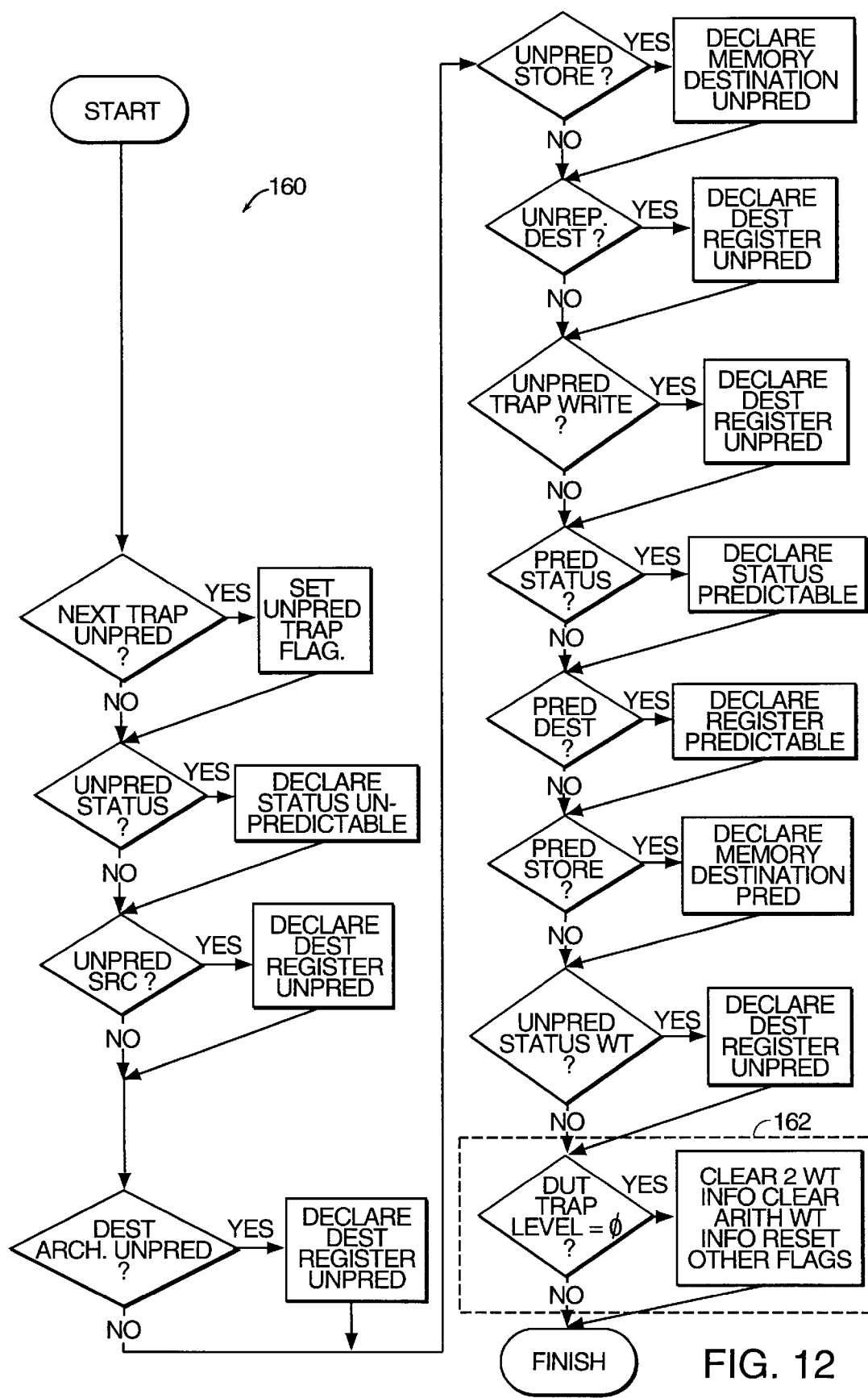
FIG. 12 is a flow diagram of the update unpredictable process of FIG. 11.

The updating of the global data structure with unpredictable status when an imprecise trap is being analyzed is shown in flowchart 160 of FIG. 12. Note that this flowchart is the same as flowchart 80 of FIG. 7 with the addition of step 162. Step 162 includes the check to see whether the DUT has reached trap level zero which indicates that all nested traps have been executed as described above. If it has, then the associated trap state recorded for each trap in the reference model trace file will all be cleared along with any other state associated with imprecise trap comparisons as will be described below.

Figure 14:
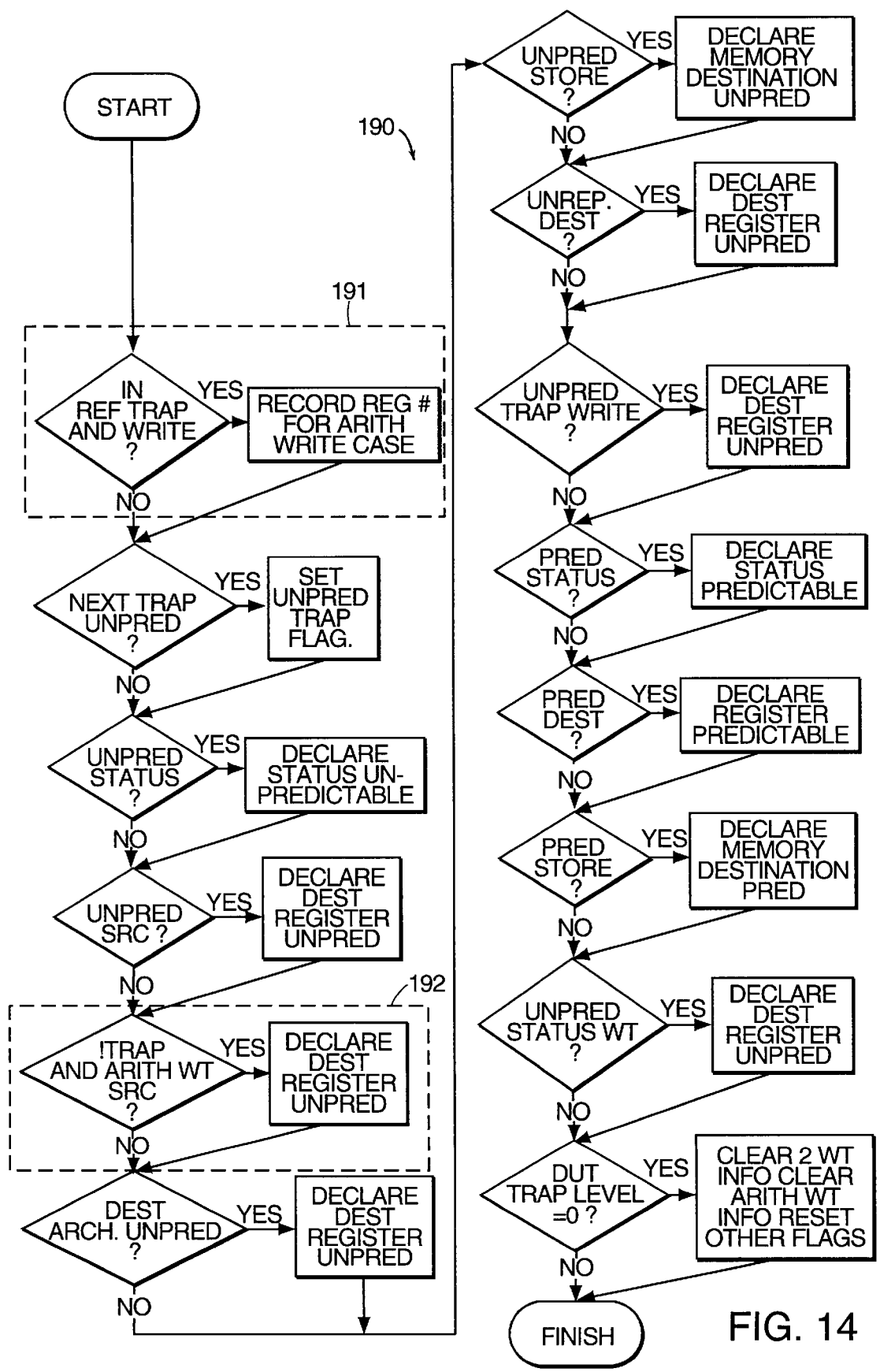
FIG. 14 is a flow diagram of the operation of verification system of FIG. 1 to detect the condition illustrated in FIG. 13.

Another condition which is accounted for by the verification system of the present invention is a write occurring during an imprecise trap. An example of this condition is shown in FIG. 13. Instruction stream 170 shows a trap occurring on the reference model as a result of executing the instruction at PC value 2. As described above, this trap (block 172) will be executed immediately by the reference model and the trace file will thus include this order of operation. The DUT may not however execute the trap immediately. Furthermore, the DUT may execute an instruction, (here the instruction at PC value 3) which relies on source data from the trap routine, before actually executing the trap routine. This is shown in stream 180 where the trap (block 182) executes after the instruction at PC value 3 where it actually needed the data from the instruction at PC value 100+n in order to match the reference model. This condition is detected by the verification system resulting in the destination register of the instruction at PC value 3 being tagged as unpredictable. The checking for this condition is illustrated by step 191 of flowchart 190 as shown in FIG. 14. Note that flowchart 190 is similar to flowchart 160 (FIG. 12) with the addition of this step 191 and 192. At step 191 the reference model trace line is examined to determined if execution is proceeding within a trap routine and whether an instruction which writes to a register is being executed. If so, the identification of the register is stored in the trap write data structure used for storing information associated with imprecise traps. Note: The data structure is one of the structures cleared by step 162 of flowchart 160 (FIG. 12). When the process reaches step 192 during a later pass through flowchart 190, and neither the reference model nor DUT is in the midst of a trap routine, and the instruction at the trace line uses a source which has its flag set in the trap write data structure then the destination register is declared unpredictable (in the global data structure).

Figure 15:
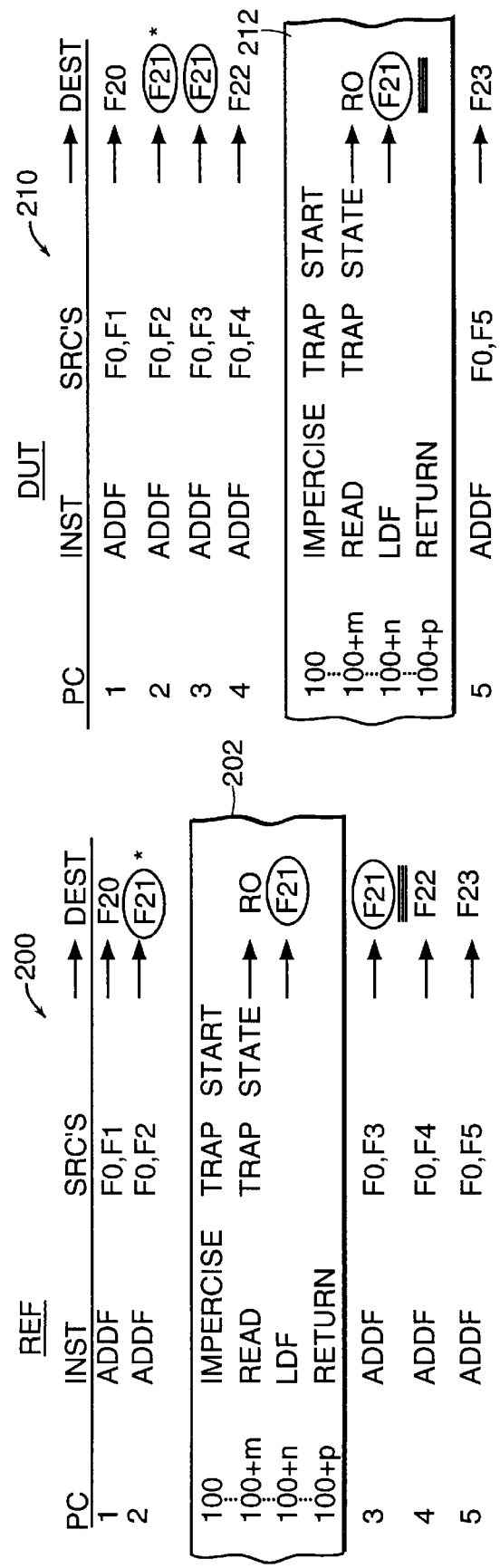
FIG. 15 is a diagram of two instruction streams which lead to an out of order write imprecise trap condition as detected by the verification system of FIG. 1.

Yet another case which may occur in an imprecise architecture is the occurrence of two writes to a location occur out of order because the trap routine of the DUT does not occur immediately after the trap causing instruction. This condition is illustrated by the instruction steams shown in FIG. 15. Here stream 210 associate with the reference model operates precisely. That is, the trap (block 202) executes immediately after the trap causing instruction (PC value 2). Thus, the write to F21 by the instruction at PC value 100+n occurs before the write to F21 at PC value 3. However, since the DUT of the preferred embodiment operates according to its imprecise architecture, the write to F21 at PC value 3 occurs before the trap routine (block 212) executes. This condition is detected by the verification system resulting in the destination data in F21 being tagged as unpredictable.

Figure 16:
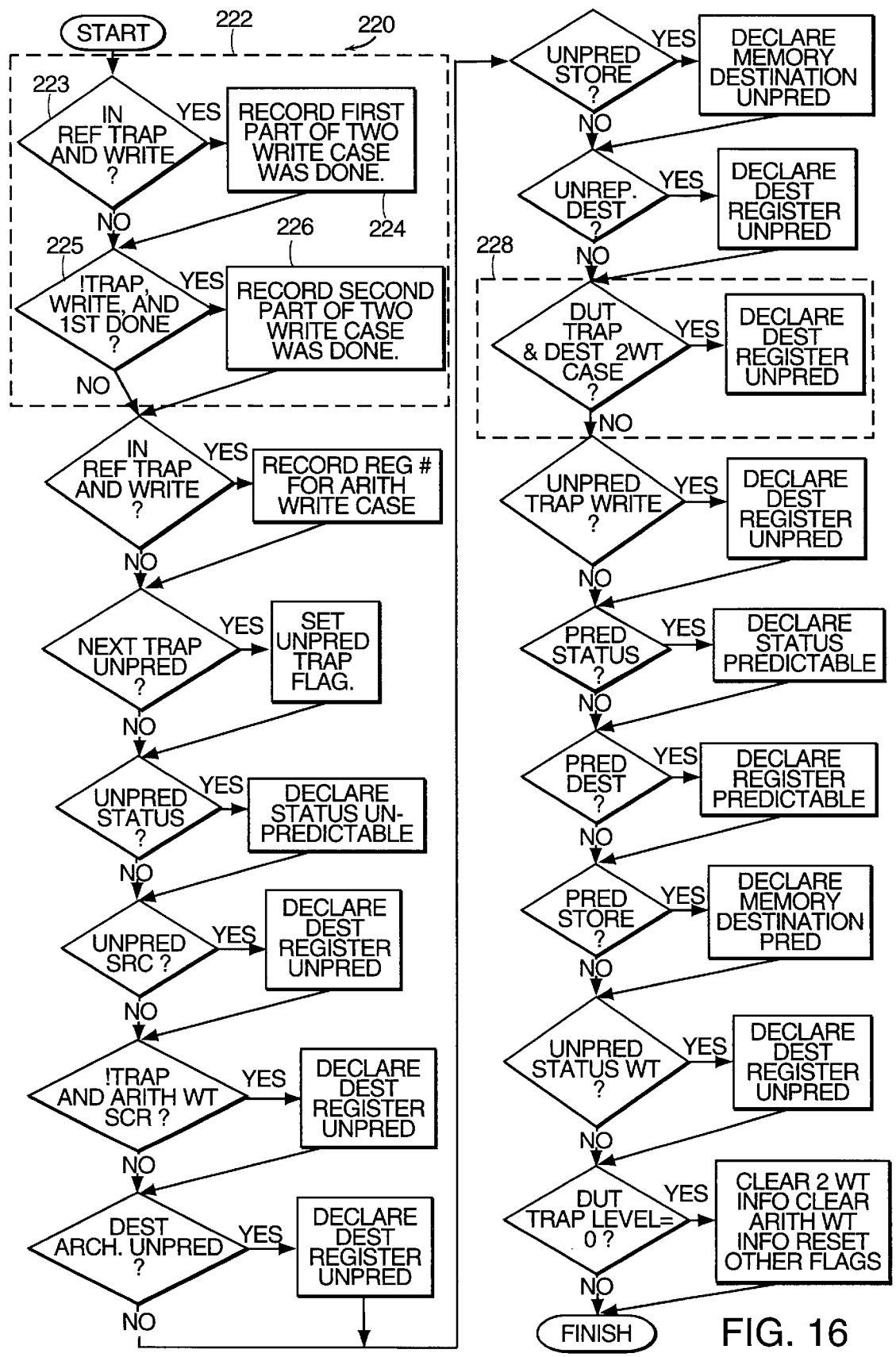
FIG. 16 is a flow diagram of the operation of the verification system of FIG. 1 to detect the condition illustrated in FIG. 15.

The operation of this detection feature is shown in flowchart 220 of FIG. 16. Note that flowchart 220 is similar to flowchart 190 of FIG. 14 with the addition of process steps 222 and 228. At step 223 a check is performed to determine if the reference model trace line is an instruction within a trap routine and whether the instruction causes a write to a register. If it is then the at step 224 the identity of the register is recorded in the "out of order write" data structure. Note: This structure is also cleared in step 162 of flowchart 160 (FIG. 12). Upon a future pass through flowchart 220, step 225 is used to detect when neither trace file indicates instructions within a trap routine. If the instruction has as its destination a register identified in the "out of order write" data structure, then that fact is indicated by a flag in the "out of order write" data structure by setting a flag associate with the previously recorded register identification. On yet a future pass through flowchart 220, step 228 is used detect that the DUT instruction is within a trap routine and that instruction has as a destination register a register that has been recorded and had its associated flag set in the "out of order write" data structure as indicate above. If both conditions are true then destination register is tagged as being unpredictable (in the global data structures).

Figure 17A:
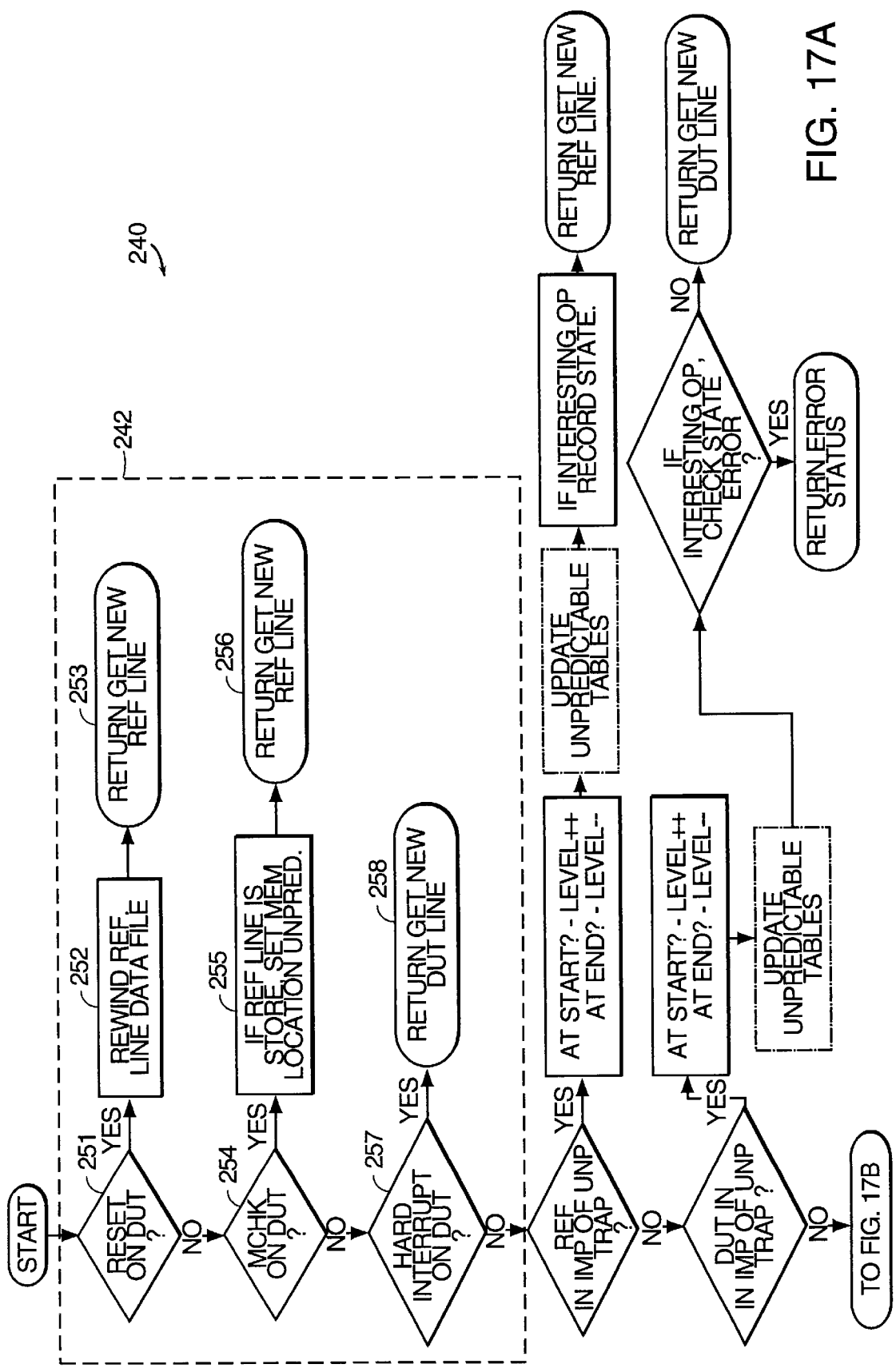
FIG. 17 is a flow diagram of the operation of the verification system of FIG. 1 in response to random system events.
Figure 17B:
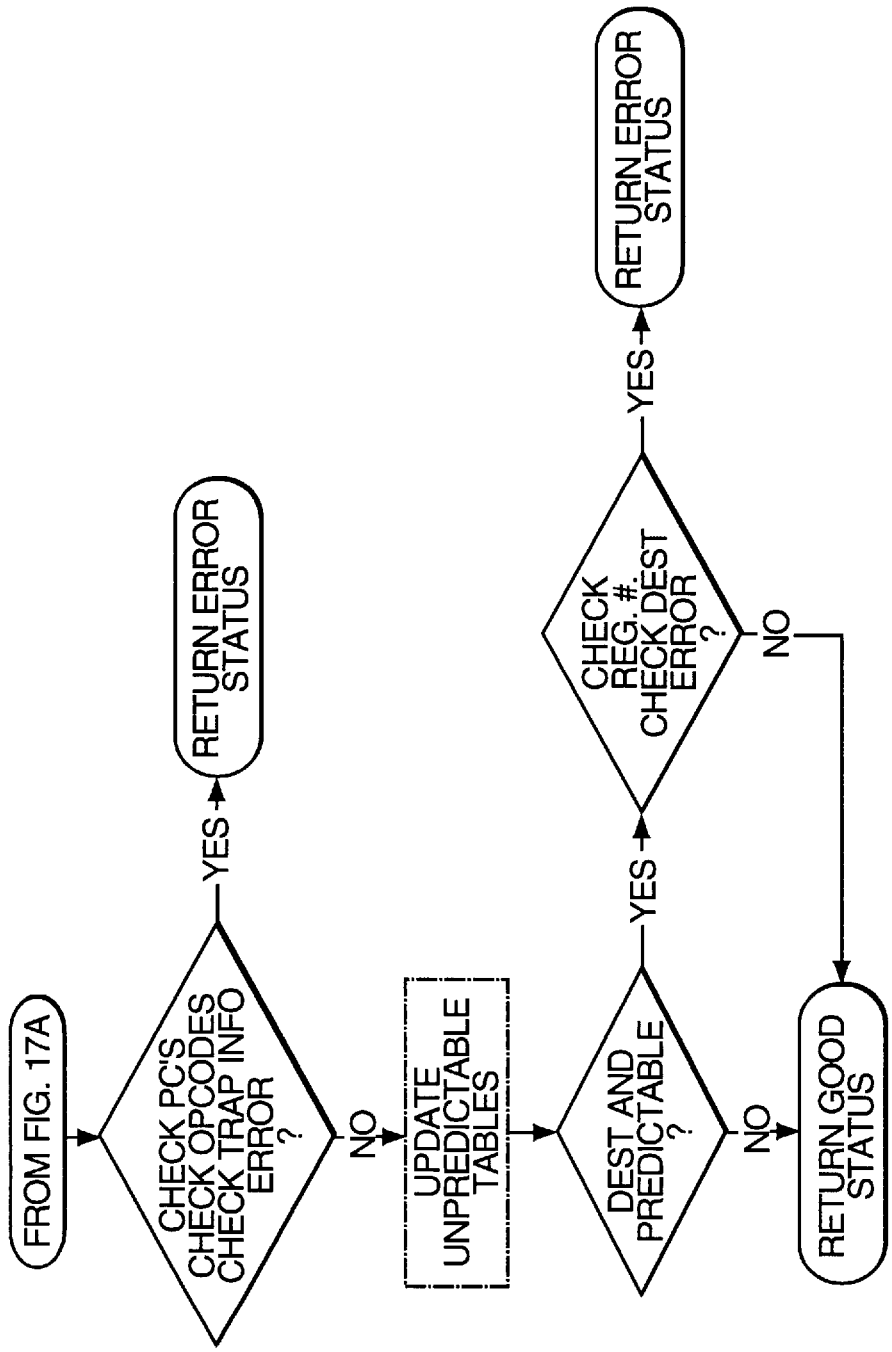

The remaining conditions handled by the verification system of the present invention are shown in flowchart 240 of FIG. 17. The flowchart of FIG. 17 is similar to flowchart 25 of FIG. 3B with the addition of process block 242. That is, this flowchart shows the complete analyze process 25 of FIG. 2. The additional steps in process block 242 are the checks of the trace files for indicators of random system events. These events include a reset occurring at the DUT which causes the DUT to re-execute the random stimuli test file from the beginning. This condition is checked for in step 251 and if it is present, the reference model trace file is rewound as indicated at step 252 and the global data structure will be cleared such that all is predictable, The process returns, with a new line being read from the reference model trace file.

Another event that is of interest is a so called machine check event on the DUT. A machine check occurs if an error condition exists within the device under test. Note this event will cause a trap to occur and halt execution of the DUT with no further trace file entries. If this occurs, it is detected at step 254, and the verification system continues to process the reference model trace file to record all memory locations stored to after the machine check. These memory stores are set to be unpredictable as indicated in step 255. Processing then moves to step 256, a return and get new trace line from the reference model.

Yet another event that may occur is a hardware interrupt on the DUT. A hardware interrupt is type of trap that will only occur in the DUT trace file and is skipped by the verification system. If this condition is indicated in the trace line, the processing returns as indicated in step 258. This will continue until the interrupt completes. The remaining steps of flowchart 240 have been described earlier in connection with other event processing capabilities of the present invention.

It can be seen then that in addition to detecting when a result is unpredictable, the present invention also tracks the unpredictable state throughout the test results to ensure that no false mismatches can occur. That is, if an instruction yields an unpredictable result, which is then used as an operand for future instruction, the result of the future instruction will not be checked. Additionally, the present invention is able to handle cases where the subsequent instruction causes a trap because of the unpredictable operand and data which may exist on the device under test and not the reference model. Furthermore, the present invention provides the capability to handle unpredictable branches and to resynchronize the program counter, such that checking can continue beyond an unpredictable branch.

Using the above described comparison method, a detailed report can be generated as to how much of a design was not verified because of the unpredictable data. This information gives verification engineers a means of gauging how effective the randomly generated test case was. In addition, a file is generated which details all of the memory addresses that included a final value that was unpredictable. This information may be used to do an intelligent comparison between the reference and DUT memory states.

Having described a preferred embodiment of the invention, it will be apparent to one of skill in the art that changes to this embodiment and other embodiments may be used without departing from the principles and spirit of the invention, the scope of which is defined by the appended claims.

What is claimed is:

1. A method executed in a computer system for testing a central processing unit (CPU) comprising the steps of:

constructing an abstract reference model of said CPU;

generating a test file of random test stimuli;

applying said test file to both said reference model and said CPU;

recording an output response of said CPU and said reference model to said test stimuli into corresponding trace files;

comparing on an entry by entry basis the contents of said corresponding trace files;

detecting differences in said compared entries;

determining whether said detected differences are due to errors or operational timing differences between said CPU and said reference model;

continuing said comparing when said detected differences are due to said operational timing differences; and tracking unpredictable data values propagated through said trace files due to said operational timing differences.

2. The method of claim 1, wherein said detecting step includes detecting imprecise trap timings between said device under test and said reference model.

3. The method of claim 1, wherein said detecting step includes detecting that an unpredictable result has been produced from an instruction execution.

4. The method of claim 1, wherein said detecting step includes detecting that execution of an instruction by said reference model has yielded an unrepresentable result, said unrepresentable result being produced when said reference model attempts to read and use data included in said test file, said data having no meaning when applied to said abstract reference model and having meaning when applied to the CPU.

5. The method of claim 1, wherein said detecting step includes detecting the presence of unpredictable data values in chip status flags.

6. The method of claim 1, wherein said detecting step includes detecting attempted execution of an undefined opcode value.

7. The method of claim 1, wherein said detecting step includes detecting the occurrence of random system events at input pins of said device under test.

8. The method of claim 1, further including the step of:

creating an output report of said entry by entry comparison.

* * * * *